United States Patent
Pedigo et al.

(10) Patent No.: US 6,797,224 B2
(45) Date of Patent: Sep. 28, 2004

(54) HEATED FILLING METHOD

(75) Inventors: Jesse Pedigo, Chippewa Falls, WI (US); Timothy Meyer, Coon Rapids, MN (US)

(73) Assignee: TTM Advanced Technologies, Inc., Chippewa Falls, WI (US)

(*) Notice: Subject to any disclaimer, the term of this patent is extended or adjusted under 35 U.S.C. 154(b) by 0 days.

(21) Appl. No.: 10/026,382

(22) Filed: Dec. 20, 2001

(65) Prior Publication Data

US 2002/0135104 A1 Sep. 26, 2002

Related U.S. Application Data

(63) Continuation-in-part of application No. 09/752,503, filed on Dec. 28, 2000, now Pat. No. 6,506,332.
(60) Provisional application No. 60/208,454, filed on May 31, 2000.

(51) Int. Cl.[7] .................. B29C 67/08; B29C 70/80; B29C 70/88
(52) U.S. Cl. .................. 264/404; 264/104; 264/267
(58) Field of Search .................. 264/104, 254, 264/267, 272.17, 251, 404, 443, 105, 273; 29/829, 846, 852; 430/315; 118/202

(56) References Cited

U.S. PATENT DOCUMENTS

| | | | |
|---|---|---|---|
| 3,601,523 A | 8/1971 | Arndt et al. | |
| 4,106,187 A | 8/1978 | Smith et al. | |
| 4,283,243 A | 8/1981 | Andreades et al. | |
| 4,360,570 A | 11/1982 | Andreades et al. | |
| 4,498,275 A | 2/1985 | Baron | 53/506 |
| 4,622,239 A | 11/1986 | Schoenthaler et al. | |
| 4,700,474 A | 10/1987 | Choinski | |

(List continued on next page.)

FOREIGN PATENT DOCUMENTS

| | | |
|---|---|---|
| EP | 0194247 A2 | 9/1986 |
| EP | 0713358 A2 | 5/1995 |
| EP | 0723388 B1 | 7/2002 |
| FR | 2684836 | 12/1991 |
| FR | 2714567 | 6/1995 |
| GB | 2120017 A | 11/1983 |
| GB | 2246912 A | 2/1992 |
| GB | 2341347 A | 3/2000 |
| JP | 53-10487 | 8/1979 |
| JP | 54-139065 | 10/1979 |
| JP | 58011172 | 1/1983 |
| JP | 62-277794 | 12/1987 |
| JP | 62-287696 | 12/1987 |
| JP | 1173696 | 7/1989 |
| JP | 1236694 | 9/1989 |
| JP | 04186792 | 7/1992 |
| JP | 04-24363 | 8/1992 |
| JP | 04239193 | 8/1992 |
| JP | 05275819 | 10/1993 |
| JP | 07176871 | 7/1995 |
| JP | 08172265 | 7/1996 |
| JP | 08191184 | 7/1996 |
| JP | 09321399 | 12/1997 |
| JP | 10256687 | 9/1998 |
| JP | 10281391 | 10/1998 |
| JP | 11054909 | 2/1999 |
| JP | 10065339 | 3/1999 |
| WO | WO 86/06243 | 10/1986 |

*Primary Examiner*—Angela Ortiz
(74) *Attorney, Agent, or Firm*—Mark Krietzman, Esq.; Greenberg Traurig, LLP

(57) ABSTRACT

A filling system includes a pressurized source of fill material and a pressure fill head wherein the fill head also includes a heating element positioned so as to transfer heat to fill material passing through the fill head. A method of filling holes using a fill material passing through a pressure fill head includes the steps of causing fill material to enter the fill head, modifying the viscosity of the fill material while it is within the fill head, and causing the modified viscosity fill material to exit the fill head and enter at least one hole.

8 Claims, 2 Drawing Sheets

U.S. PATENT DOCUMENTS

| | | | |
|---|---|---|---|
| 4,777,721 A | 10/1988 | Choinski | |
| 4,783,247 A | 11/1988 | Seibel | |
| 4,884,337 A | 12/1989 | Choinski | |
| 4,954,313 A | 9/1990 | Lynch | |
| 4,964,948 A | 10/1990 | Reed | |
| 4,995,941 A | 2/1991 | Nelson et al. | |
| 5,053,921 A | 10/1991 | Nelson et al. | |
| 5,058,265 A | 10/1991 | Goldfarb | |
| 5,117,069 A | 5/1992 | Higgins, III | |
| 5,133,120 A | 7/1992 | Kawakami et al. | |
| 5,145,691 A | 9/1992 | Kawakami et al. | |
| 5,220,723 A | 6/1993 | Okada | |
| 5,274,916 A | 1/1994 | Kawabata et al. | |
| 5,277,854 A | 1/1994 | Hunt | |
| 5,332,439 A | 7/1994 | Watanabe et al. | |
| 5,451,721 A | 9/1995 | Tsukada et al. | |
| 5,456,004 A | 10/1995 | Swamy | |
| 5,471,091 A | 11/1995 | Pasch et al. | |
| 5,532,516 A | 7/1996 | Pasch et al. | |
| 5,540,779 A | 7/1996 | Andris et al. | |
| 5,578,151 A | 11/1996 | Andris et al. | |
| 5,591,353 A | 1/1997 | Davignon et al. | |
| 5,610,103 A | 3/1997 | Xu et al. | |
| 5,637,834 A | 6/1997 | La Bate, Jr. et al. | |
| 5,662,987 A | 9/1997 | Mizumoto et al. | |
| 5,699,613 A | 12/1997 | Chong et al. | |
| 5,707,575 A * | 1/1998 | Litt et al. | 264/104 |
| 5,744,171 A | 4/1998 | Schneider | |
| 5,744,285 A | 4/1998 | Felten et al. | |
| 5,753,976 A | 5/1998 | Harvey | |
| 5,761,803 A | 6/1998 | St. John et al. | |
| 5,766,670 A | 6/1998 | Arldt et al. | |
| 5,822,856 A | 10/1998 | Bhatt et al. | |
| 5,824,155 A | 10/1998 | Ha et al. | |
| 5,851,344 A | 12/1998 | Xu et al. | |
| 5,887,345 A * | 3/1999 | Kulesza et al. | 29/852 |
| 5,893,404 A | 4/1999 | Mendez et al. | 164/71.1 |
| 5,906,042 A | 5/1999 | Lan et al. | |
| 5,925,414 A | 7/1999 | Buechele et al. | |
| 5,994,779 A | 11/1999 | Gardner et al. | |
| 6,000,129 A | 12/1999 | Bhatt et al. | |
| 6,009,620 A | 1/2000 | Bhatt et al. | |
| 6,015,520 A * | 1/2000 | Appelt et al. | 264/104 |
| 6,079,100 A | 6/2000 | Farquhar et al. | |
| 6,090,474 A | 7/2000 | Johansson et al. | |
| 6,106,891 A | 8/2000 | Kulesza et al. | |
| 6,134,772 A * | 10/2000 | Arldt et al. | 29/620 |
| 6,138,350 A | 10/2000 | Bhatt et al. | |
| 6,149,857 A | 11/2000 | McArdle et al. | |
| 6,153,508 A | 11/2000 | Harvey | |
| 6,184,133 B1 | 2/2001 | Iijima et al. | |
| 6,261,501 B1 | 7/2001 | Miyagawa et al. | |
| 6,264,862 B1 * | 7/2001 | Liaw | 264/102 |
| 6,276,055 B1 | 8/2001 | Bryan et al. | |
| 6,281,488 B1 | 8/2001 | Fleming | |
| 6,282,782 B1 | 9/2001 | Biunno et al. | |
| 6,398,099 B1 * | 6/2002 | Liaw | 228/33 |
| 6,427,325 B1 * | 8/2002 | Johansson et al. | 29/852 |
| 6,454,154 B1 | 9/2002 | Pedigo | 228/33 |
| 6,506,332 B2 * | 1/2003 | Pedigo | 264/443 |

\* cited by examiner

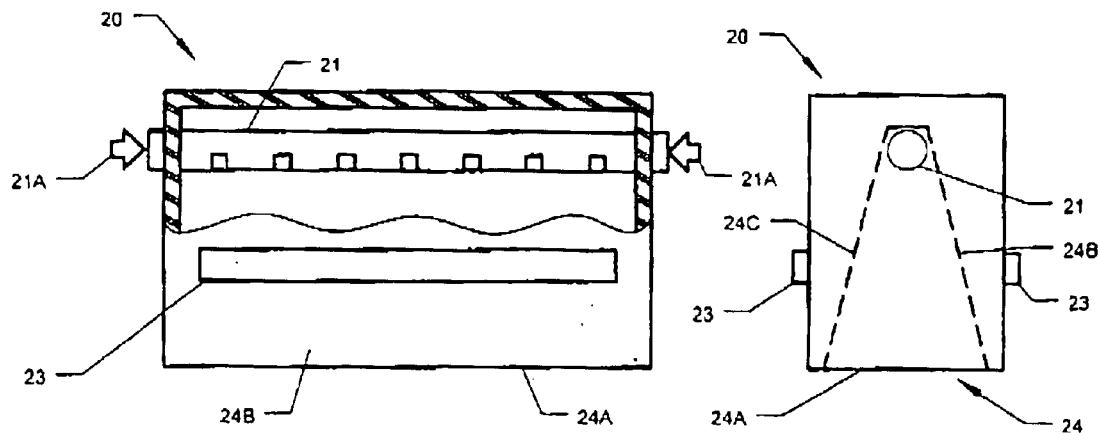
Fig. 2A  Fig. 2B
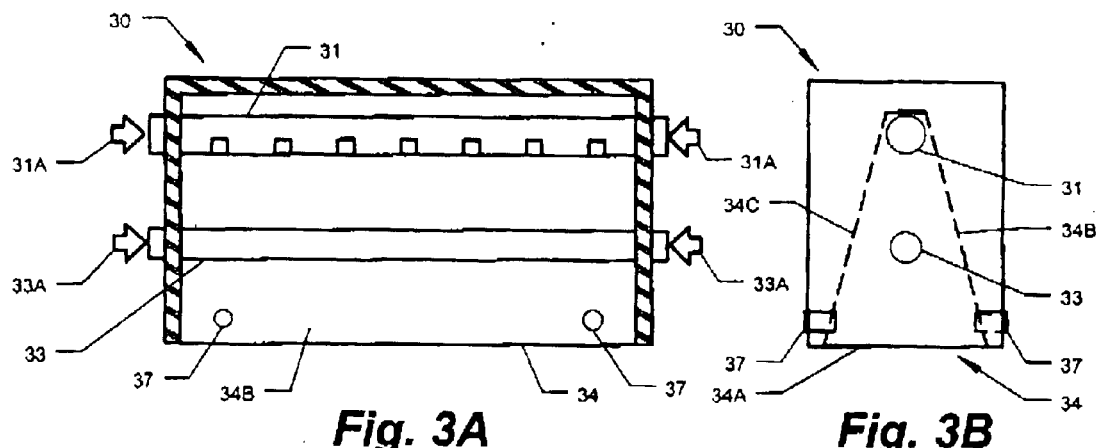
Fig. 3A  Fig. 3B
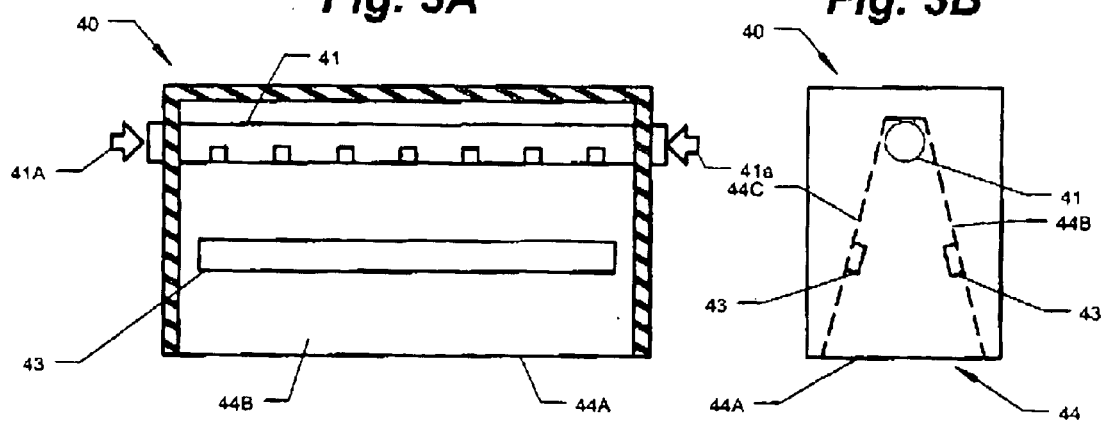
Fig. 4A  Fig. 4B

HEATED FILLING METHOD

This is a continuation-in-part of U.S. application Ser. No. 09/752,503, filed Dec. 28, 2000, now U.S. Pat. No. 6,506,332 which claims the benefit of U.S. provisional application No. 60/208,454 filed May 31, 2000. Each of the foregoing applications is incorporated herein by reference in its entirety.

FIELD OF THE INVENTION

The present invention relates to the field of placing fill materials into the vias or holes of an electronic substrate.

BACKGROUND OF THE INVENTION

A common structure in various electronics packages, such as laminate packages, wired circuit boards, ceramic substrates, and hybrid circuits, is a via or hole. A via or hole is a vertical opening which can be filled with conducting material used to connect circuits on various layers of a substrate or electronics packages to one another. Holes in certain devices may connect to a semi-conducting substrate. A hole generally starts as an empty cylindrical opening in an electronics package which is formed by drilling. The hole is then plated with an electrical conductor such as copper or tin. Plating may be done over the entire panel or device, or may be done with a pattern, dot, or button feature. The plating process results in a hole that is an opening with a plated, electrically conductive layer on the inner surface of the opening. Plating may also result in plating all or part of the surface of the device. Plating of the hole provides the primary electrical contact at the various layers within the device. The following step is to fill the hole with an electrically conductive, thermally conductive or nonconductive paste. The reasons for filling the hole after plating include providing a secondary or fail safe electrical connection, to provide structural integrity, to prevent chemical process entrapment from down-line operations, or to provide thermal conductivity to remove heat from the inner circuit layers of the resulting device. Another reason is that filling the hole also controls the breaking of electrical connections formed when the plate or finished electrical device thermally cycles between operating temperatures and non-operating temperatures.

Various methods relating to hole filling are discussed in pending U.S. patent application Ser. Nos. 09/752,629 and 09/752,503 which are directed to devices and methods for delivering a fill material using a delivery system that includes a pressurized supply of fill material and a pressure head attached to the pressurized supply of fill material.

SUMMARY OF THE INVENTION

The present invention is directed to a filling system includes a pressurized source of fill material and a pressure fill head wherein the fill head also includes a heating element positioned so as to transfer heat to fill material passing through the fill head. A method of filling holes using a fill material passing through a pressure fill head includes the steps of causing fill material to enter the fill head, modifying the viscosity of the fill material while it is within the fill head, and causing the modified viscosity fill material to exit the fill head and enter at least one hole.

Incorporation of a heating element into a pressure fill head may involve including a heating element that converts electrical energy into heat as part of the fill head, and/or pumping a heated material through a radiator that is part of the fill head.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 2A is a front cutaway view of a second embodiment of a heated fill head according to the present invention.

FIG. 2B is a side view of the head of 2A.

FIG. 3A is a front partial cutaway view of a third embodiment of a heated fill head according to the present invention.

FIG. 3B is a side view of the head of 3A.

FIG. 4A is a front partial cutaway view of a fourth embodiment of a heated fill head according to the present invention.

FIG. 4B is a side view of the head of 3A.

DETAILED DESCRIPTION

Figures 1A, 1B:
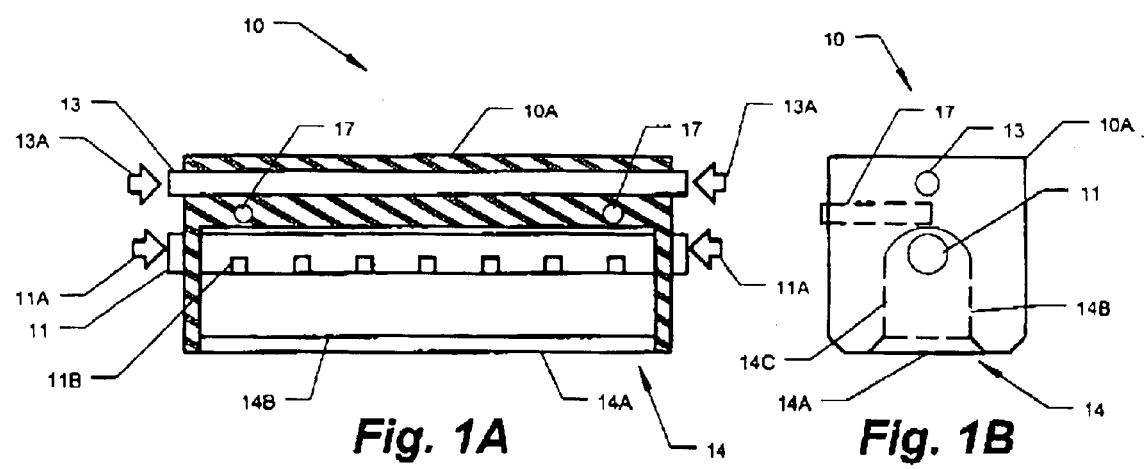
FIG. 1A is a front cutaway view of a first embodiment of a heated fill head according to the present invention.
FIG. 1B is a side view of the head of 1A.

Unfortunately, not all fill materials may be advantageously used with all known fill devices and methods and all types of holes. In particular, the use of non-shear-thinning fill materials that have a very high surface tension tends to make hole filling problematic even if a pressure head is used. Although some attempts have been made to make the use of high viscosity materials more advantageous by increasing room temperature, the results of such attempts have not been entirely satisfactory. This may be due, at least in part, to the fact that raising room temperature tends to increase operator discomfort, be difficult to control, and increase costs.

However, heating a pressure fill head such as the head disclosed in pending U.S. patent application Ser. Nos. 09/752,629 and 09/752,503 provides the means for controllably reducing fill material viscosity in a cost effective manner and without adversely affecting the operator work environment.

Referring first to FIG. 1, a filling system comprises a pressurized source of fill material 11A and a pressure fill head 10 wherein the fill head also comprises fill material chamber/flow-path 14, a fill material dispersion tube 11 (having outlets 11B), and a heating element 13 positioned to heat body 10A of fill head 10. Body 10A in turn heats any fill material from source 11A flowing through chamber 14 hole walls 14B and 14C. The heating element 13 of FIG. 1 is a tube that functions as a radiator to transfer heat from circulating fluid 13A contained within heating element 13 to fill head body 10A. Fill head 12 also comprises thermal probes 17 that allow the temperature of the head body 10A to be monitored.

Pressure fill head 12 is preferred to be a head similar to that disclosed in pending U.S. patent application Ser. Nos. 09/752,629 and 09/752,503 with the fill head being coupled to a source of pressurized fill material by a fill material inlet, the fill head having an elongated fill material outlet 14B which is substantially larger than the fill material inlet (the inlets to dispersion tube 11). In such an embodiment it is preferred that the heating element 13 be elongated, positioned within body of the fill head, and aligned with the fill material outlet 14B.

Providing maximum surface exposure between the fill material and any heat source helps to prevent hot spots from developing within the fill material. Thus, it is preferred that the heating of any fill material passing through head be done in a manner which maximizes the surface area in contact with the fill material of whatever surface ultimately transfers heat to the fill material. In many instances this is best accomplished by heating the head body 10A so that heat is transferred by the walls of chamber 14. Most embodiments in which the heating element directly contacts the fill material are less preferred for having a smaller surface area in contact with the fill material. However, in some instances, the heating element may be an insert that actually defines the walls of chamber 14 and may include protrusions that any fill material flowing through the chamber would have to flow around so as to further increase the surface area of the heating element in contact with the fill material and to decrease the risk of hotspots forming within the fill material.

Referring to FIG. 2, a filling system according to a second embodiment of the present invention comprises a pressurized source of fill material 21A and a pressure fill head 20 wherein the fill head also comprises fill material chamber/flow-path 24, a fill material dispersion tube 21, and a heating element 23 positioned so as to transfer heat into any fill material 21A passing through flow-path 24 of the fill head 22. The fill head of FIG. 2 operates similarly to the fill head of FIG. 1 except that the the body of fill head 20 is heated by heating elements 23 located on the external surface of fill head 20. Although locating the heating element 23 on the outside may facilitate installation of the heating element on existing fill heads, it is less preferred because of possible heat losses from heat transferred to the surrounding environment rather than into fill body 20.

Referring to FIG. 3, a filling system according to a third embodiment of the present invention comprises a pressurized source of fill material 31A and a pressure fill head 30 wherein the fill head also comprises fill material chamber/flow-path 34, a fill material dispersion tube 31, and a heating element 33 positioned so as to transfer heat into any fill material 31A passing through flow-path 34 of the fill head 32. The heating element 33 of FIG. 3 is a tube that functions as a radiator to transfer heat from circulating fluid 33A contained within heating element 33 to any fill material 31A passing through the fill head 32. Flow-path 34 comprises fill head outlet 34A and walls 34B and 34C. Fill head 32 also comprises thermal probes 37 that provide a visual indication of the temperature of the fill material 31A exiting the fill head. This embodiment is less preferred than that of FIG. 1 because any heating element located within chamber 14 will typically have a surface area less than that provided by the walls of chamber 14, and will thereby likely have less uniform heating and provide for hot spots.

Referring to FIG. 4, a filling system according to a fourth embodiment of the present invention comprises a pressurized source of fill material 41A and a pressure fill head 42 wherein the fill head also comprises fill material chamber/flow-path 44, a fill material dispersion tube 41, and heating elements 43 positioned so as to transfer heat into any fill material 41A passing through flow-path 44 of the fill head 42. The heating elements 43 of FIG. 4 is a substantially planar heating element positioned long the walls 44A and 44B of fill material flow path 44 that converts electricity provided to heating element 43 into heat. The flow head of FIG. 4 operates in a fashion similar to that of FIG. 3. It is contemplated that increasing the size or number of heating elements 43 so that they cover substantially all of the surface of chamber 14 may prove advantageous.

In preferred embodiments, the fill head will comprise one or more transducers/probes or oil pressure gauge 17 that can be utilized to monitor and/or control the temperature and/or viscosity of the fill material leaving the fill head. Monitoring may be accomplished by providing one or more visual displays on the print head itself, or remotely hole signals transmitted from the print head.

Preferred embodiments will also have any heated surfaces (such as walls 14B and 14C of FIG. 1) that come in contact with the fill material coated or otherwise treated to prevent the fill material from adhering to the heated surface. Such coating and treatments may include anodizing and/or TEFLON™ coating.

It is contemplated that a fill head as described herein may be used to fill holes by causing fill material to enter the fill head; modifying the viscosity of the fill material while it is within the fill head; and causing the modified viscosity fill material to exit the fill head and enter at least one hole or hole. In some instances, the fill material will have a viscosity V1 prior to entering the fill head and a viscosity V2 upon exiting the fill head wherein V2 is at least X % less than V1, and X is one of 1, 5, 10, 25, and 50. The actual value of V2 will depend in part on the aspect ratio of the hole to be filled. In other instances, the fill material will have a temperature T1 prior to entering the fill head and a temperature T2 upon exiting the fill head wherein T1 does not equal T2. In such instances, it is contemplated that it may be advantageous if T2 is Y % greater than T1, and Y is one 5, 10, 25, and 50. It is also contemplated that in such instances it may be advantageous if T2 is at least 23 degrees Celsius. The foregoing parameters will generally vary depending on the aspect ratio of the holes to be filled and the starting value of V1.

Depending on the type of heating element used, a hole filling method may also involve causing a heated fluid that is not the fill material to pass through the fill head while the fill material is passing through the fill head, and/or may involve providing an electric current to the heating element while the fill material is passing through the fill head. Embodiments utilizing a heated fluid will typically have some external supply of a heated fluid such as water, ethylene glycol/water, oil, or some other fluid capable of thermal transfer.

Thus, specific embodiments and applications of viscosity changing hole pressure fill heads have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of filling holes using a fill material passing through a pressure fill head comprising:

causing fill material to enter the fill head;

modifying the viscosity of the fill material; modifying the viscosity from a viscosity V1 prior to entering the fill head to a viscosity V2 upon exiting the fill head, wherein V2 is at least 1% less than V1 while it is within the fill head; and, causing the modified viscosity fill material to exit the fill head and enter at least one hole.

2. The method of claim 1 wherein the step of modifying the viscosity of the fill material includes modifying a temperature of the fill material from a temperature T1 prior to entering the fill head to a temperature T2 upon exiting the fill head wherein both T1 and T2 are less then 40 degrees Celsius and T1 does not equal T2.

3. The method of claim 2 wherein T2 is at least 5% greater than T1.

4. The method of claim 2 wherein T2 is at least 23 degrees Celsius.

5. A method of filling holes using a fill material passing through a pressure fill head comprising:

causing fill material to enter the fill head;

modifying the viscosity of the fill materials includes causing a heated fluid to pass through the heating element of the fill head while the fill material is passing through the fill head;

wherein the fill head comprises a heating element positioned to heat the fill head, and positioned so as not to contact any fill material passing through the fill head and wherein the step of modifying the viscosity of the fill material involves heating the fill head to indirectly heat the fill material; and, causing the modified viscosity fill material to exit the fill head and enter at least one hole.

6. The method of 5 wherein the heated fluid is one of: ethylene glycol/water, oil, and water.

7. The method of 5 wherein the step of modifying the viscosity of the fill material includes providing an electric current to a heating element coupled to the fill head while the fill material is passing through the fill head.

8. A method of filling holes using a fill material passing through a pressure fill head comprising:

causing fill material to enter the fill head;

modifying the viscosity of the fill material with a heating element in the fill head positioned within a flow path of the fill material passing through the fill head and wherein the step of modifying the viscosity of the fill material includes heating the fill material directly; while it is within the fill head; and, causing the modified viscosity fill material to exit the fill head and enter at least one hole.

* * * * *